United States Patent [19]
Lee et al.

[11] Patent Number: 5,617,041
[45] Date of Patent: Apr. 1, 1997

[54] METHOD AND APPARATUS FOR REDUCING COUPLING SWITCHING NOISE IN INTERCONNECT ARRAY MATRIX

[75] Inventors: Napoleon W. Lee, Milpitas; Wei-Yi Ku; Hy V. Nguyen, both of San Jose; Sholeh Diba, Los Gatos, all of Calif.

[73] Assignee: Xilinx, Inc., San Jose, Calif.

[21] Appl. No.: 459,236

[22] Filed: Jun. 2, 1995

[51] Int. Cl.⁶ .............................................. H03K 19/177
[52] U.S. Cl. .................................. 326/39; 326/21; 326/45
[58] Field of Search .............................. 326/38, 39, 41, 326/45, 21

[56] References Cited

U.S. PATENT DOCUMENTS

| | | | |
|---|---|---|---|
| 4,758,746 | 7/1988 | Birkner | 326/38 |
| 4,789,951 | 12/1988 | Birkner | 326/38 |
| 5,028,821 | 7/1991 | Kaplinsky | 307/465 |
| 5,168,177 | 12/1992 | Shankar | 326/39 |
| 5,300,830 | 4/1994 | Hawes | 326/41 |

OTHER PUBLICATIONS

"The Programmable Logic Data Book" copyright 1994, Xilinx, Inc., 2100 Logic Drive, San Jose, CA 95124, pp. 3-1 to 3-90.

*Primary Examiner*—Edward P. Westin
*Assistant Examiner*—Benjamin D. Driscoll
*Attorney, Agent, or Firm*—Patrick T. Bever; Jeanette S. Harms

[57] ABSTRACT

In an EPLD, a feedback switching circuit is provided on a feedback line connected between a macrocell output line and a interconnect matrix wordline, the switching circuit including a memory element and a switch for passing a macrocell output signal from the output line to the interconnect matrix wordline when the memory element is in a first state, and for blocking the macrocell output signal when the memory element is in a second state. This prevents coupling noise in the interconnect matrix because unnecessary feedback signals are prevented from entering the interconnect matrix. In another embodiment, a method is provided in which unused macrocells produce counteractive switching signals in the interconnect matrix to reduce the coupling effect caused by a multiple concurrent switching event. In another embodiment, a sense amplifier is provided in which an EPROM shields coupling between wordlines and bitlines in an interconnect matrix.

2 Claims, 8 Drawing Sheets

METHOD AND APPARATUS FOR REDUCING COUPLING SWITCHING NOISE IN INTERCONNECT ARRAY MATRIX

TECHNICAL FIELD

The present invention relates to programmable logic devices (PLDs), and in particular to circuitry and methods for reducing noise in the interconnect matrix of an erasable programmable logic device (EPLD).

BACKGROUND ART

FIG. 1 shows a simplified block diagram of an EPLD 100. EPLDs typically include two or more functional blocks (FB) 110 connected to receive input signals on FB input lines 115 from an interconnect matrix 120. Each function block 110 is made up of a number of macrocells (discussed below) which transmit output signals to input/output (I/O) blocks 130 on output lines 125. In addition, feedback signals from each macrocell are transmitted to interconnect matrix 120 on feedback lines 135. Finally, input signals are transmitted from I/O block 130 on input lines 145.

FIG. 2 shows in additional detail how signals are passed to and from I/O blocks 130 in Xilinx XC7000 series EPLDs, which are described in additional detail in Section 3 of the 1994 Xilinx Programmable Logic Data Book, which is incorporated by reference herein. Data signals generated in interconnect matrix 120 are transmitted on FB input lines 115 to function blocks 110. Output enable lines 155 transmit control signals for switching the appropriate circuitry of I/O block 130 such that macrocell output signals are transmitted to I/O pins 150. In XC7000 series EPLDs, each function block 110 typically includes nine macrocells, the outputs from which being selectively transmitted to I/O block 130 via output lines 125 and to interconnect matrix 120 on feedback lines 135, this transmission being controlled by output enable (OE) signals present on output enable lines 155.

FIG. 3 shows macrocell 160 and I/O block 130 in further detail. Only feedback control circuitry of macrocell 160 is described herein—a description of the input and logic producing portions of macrocell 160 are omitted. FIG. 3 shows an output control portion 130A and an input control portion 130B of I/O block 130 which are associated with an I/O pin 151. All of the circuitry shown in FIG. 3 is used in Xilinx XC7000 series EPLDs, and is explained in additional detail in the 1994 Xilinx Programmable Logic Data Book.

In the following description, individual signal lines are indicated by parenthesized digits. For example, one of the nine FB output lines 125 (see FIGS. 1 and 2) is identified by "125(1)".

Referring to FIG. 3, output signals from macrocell 160 are transmitted on output line 125(1) to I/O pin 151. Output control stage 130A receives control signals on a global fast output enable (OE) line and from output enable line 155(1). Based on these control signals, output control stage 130A controls a switch 131, which in turn controls transmission of the output signal from output line 125(1) to I/O pin 151. For example, when the output enable signal on output enable line 155(1) is low, switch 131 is turned off, and output signals on output line 125(1) are blocked by switch 131 from being transmitted to I/O pin 151. In this state, I/O pin 151 may be used to input signals into the interconnect matrix through the input control stage 130B on input line 145(1). Details regarding portions of output control state 130A and input control stage 130B which are not described herein can be found in the 1994 Xilinx Programmable Logic Data Book.

Referring to macrocell 160, feedback to the interconnect matrix is controlled by a switch 161 which, in turn, is controlled through an OR gate 163 by an output enable signal transmitted on output enable line 155(1), and by the programmed state of a feedback enable EPROM cell 162. For example, if the output enable signal on output enable line 155(1) is high, then switch 161 is turned on and the output signal on output line 125(1) is fed back to the interconnect matrix via feedback line 135(1). This feedback also occurs when feedback control EPROM cell 162 is programmed to apply a high signal to switch 161.

Several EPLDs, such as XC7000 series EPLDs produced by Xilinx, Inc. of San Jose, Calif., incorporate "cross-point" interconnect matrices in which every wordline is programmably connectable to every bitline, much like the programmable AND planes of a PAL. The "cross-point" type of interconnect matrix is described in U.S. Pat. No. 5,028,821, and is also described in co-owned U.S. application Ser. No. 08/430,207, filed Apr. 26, 1995, entitled "CROSS-POINT INTERCONNECT STRUCTURE WITH REDUCED AREA" [Attorney Docket Number X-143/M-3077], which is incorporated herein in its entirety. An advantage of cross-point interconnect matrices is 100% routability—that is, every wordline can be connected to every bitline within a cross-point interconnect matrix.

FIG. 4 shows a known sense amplifier 170 used in a cross-point interconnect matrix 120. The operation of this sense amplifier is described in the Background section of co-owned U.S. application Ser. No. 08/459,066, filed Jun. 2, 1995, entitled "SENSE AMPLIFIER FOR PROGRAMMABLE LOGIC DEVICE HAVING SELECTABLE POWER MODES" [attorney docket X-152-1/M-3372], which is incorporated herein in its entirety. Therefore, the following description will be limited to specific portions of sense amplifier 170 which are relevant to the invention described below.

Referring to FIG. 4, each sense amplifier 170 of interconnect matrix 120 is associated with one bitline BL, and transmits one product term from bitline BL to the AND array (see FIG. 3) of a function block on one of the FB input lines 115. As shown in FIG. 4, each wordline WL1 through WLn is selectively connectable through an EPROM 171 to bitline BL. In addition, each wordline WL1 through WLn is connected to one feedback line 135 or one input line 145. As such, every feedback line 135 and every input line 145 connected to one of the wordlines WL1 through WLn is selectively connectable to every FB input line 115 through cross-point interconnect matrix 120.

Signals on wordlines WL1 through WLn are selectively transmitted to bitline BL (in an inverted form) via EPROMs 171-1 through 171-n. For example, if EPROM 171-1 is erased (conductive), then a high signal on wordline WL1 turns on EPROM 171-1, thereby creating a low signal on bitline BL by connecting bitline BL to virtual ground VG through EPROM 171-1. Conversely, if EPROM 171-1 is programmed (non-conductive), then high signals on wordline WL1 will not turn on EPROM 171-1.

Long time users of EPLDs are aware of coupling noises in the interconnect matrix when multiple unrelated word lines are switching concurrently. The inventors of the present application have determined that this noise occurs in part because of two primary phenomenons: a) capacitive coupling between word lines and bit lines of the interconnect matrix, and b) noise on the internal Vcc and Vss power buses because of excessive concurrent wordline switching.

Capacitive coupling occurs, for example, when word lines connected to feedback lines from the macrocells are simultaneously shifted from high to low, or from low to high voltage potentials. As an example, when several macrocells of an EPLD implement a counter, the output signals from all of these macrocells switch from high to low when the counter "turns over" (i.e., every macrocell simultaneously shifts from a "1" to a "0"). In addition, the counter is typically driven by a common clock signal, so that all of the macrocells switch concurrently. This concurrent multiple macrocell switching event causes a large capacitive effect (coupling) between the bitlines and wordlines of the EPLD, thereby resulting in bitline noise.

Noise also occurs on the internal Vcc and Vss power buses when a large number of wordlines are switched simultaneously from high to low, or from low to high. Simultaneous switching creates a crowbar effect which causes large fluctuations in the voltage level of the power buses.

SUMMARY

In accordance with the present invention, several apparatus and methods are provided for reducing noise caused by coupling between bitlines and wordlines within an interconnect matrix.

In accordance with a first aspect of the present invention, switching circuitry is provided in the macrocells of an EPLD for selectively preventing a macrocell output signal from being fed back to the interconnect matrix when the macrocell output signal is transmitted to an input/output pin. This prevents coupling noise because unused feedback signals do not enter the interconnect matrix. In one embodiment, the switching circuitry includes a memory element for storing a control signal, and a switch for passing the feedback signal when the memory element is in a first state, and for blocking the feedback signal when the memory element is in a second state.

In accordance with a second aspect of the present invention, sense amplifier circuits are provided in which EPROM cells are connected between wordline access transistors and the bitlines of the interconnect matrix. The EPROM cells act as effective shields which minimize the coupling effect between the wordlines and bitlines.

In accordance with a third aspect of the present invention, large numbers wordlines which are clocked by a common clock signal are identified, and unused macrocells are utilized to produce complementary signals, thereby reducing the coupling effect of the simultaneously switching wordlines.

BRIEF DESCRIPTION OF THE DRAWINGS

These and other features, aspects and advantages of the present invention will become better understood with regard to the following description, appended claims, and accompanying drawings, where:

DETAILED DESCRIPTION

Figure 5:
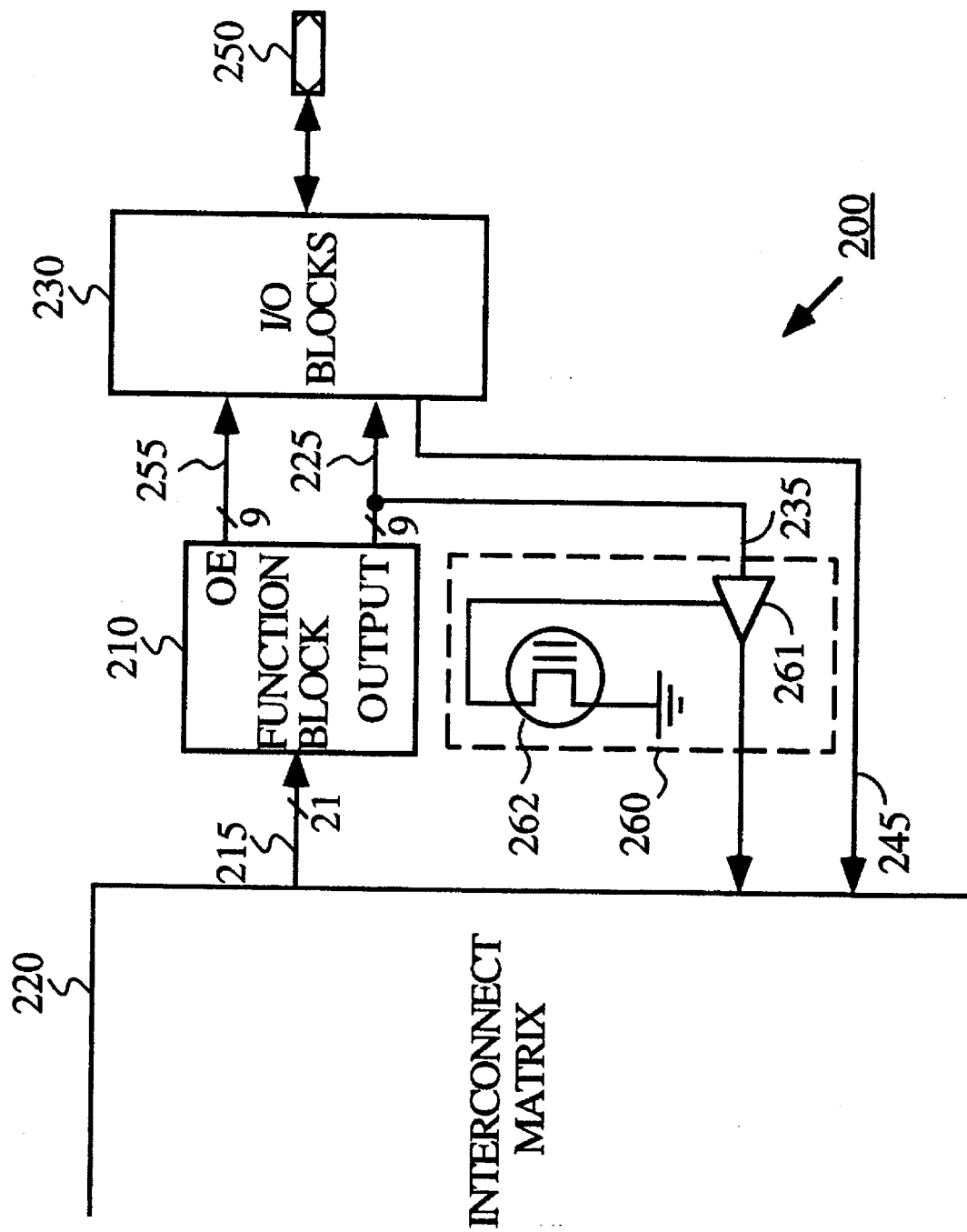
FIG. 5 is a simplified block diagram showing an EPLD in accordance with a first aspect of the present invention.

FIG. 5 is a block diagram showing an essential portion of an EPLD 200 incorporating a first aspect of the present invention. In accordance with the first aspect, EPLD 200 includes a plurality of function blocks 210 (one shown), each function block 210 including an AND array and several macrocells (in this example, nine). The AND array portion of each function block 210 receives input signals on function block (FB) input lines 215 (21 in this example) from a cross-point interconnect matrix 220. In addition, each function block 210 generates nine macrocell output signals (corresponding to the nine macrocells) which are selectively transmitted to I/O block 230 on output lines 225 and/or selectively transmitted back into interconnect matrix 220 via feedback lines 235. As in the prior art EPLD, discussed above, transmission of macrocell output signals from function block 210 to I/O block 230 is controlled by output enable OE signals transmitted on OE lines 255. Finally, signals can be input into interconnect matrix 220 from input/output (I/O) pins 250 via device input lines 245.

In accordance with the present invention, each of the feedback lines 235 is controlled by a feedback switching circuit 260. Feedback switching circuit 260 is connected along feedback line 235 between macrocell output line 225 and a wordline of interconnect matrix 220. In FIG. 5, feedback switching circuit 260 is represented by a switch 261 which is controlled by a memory cell 262. When it is desired to feed back a macrocell output signal into interconnect matrix 220, memory cell 262 is programmed such that a control terminal of switch 261 is biased to pass signals along feedback line 235 to a wordline of interconnect matrix 220. Conversely, when a macrocell output signal is transmitted to output pin 250, memory cell 262 is programmed such that switch 261 blocks signals from entering interconnect matrix 220 on feedback line 235. With this arrangement, unnecessary wordline switching is eliminated in interconnect matrix 220, thereby reducing coupling noise.

Figure 6:
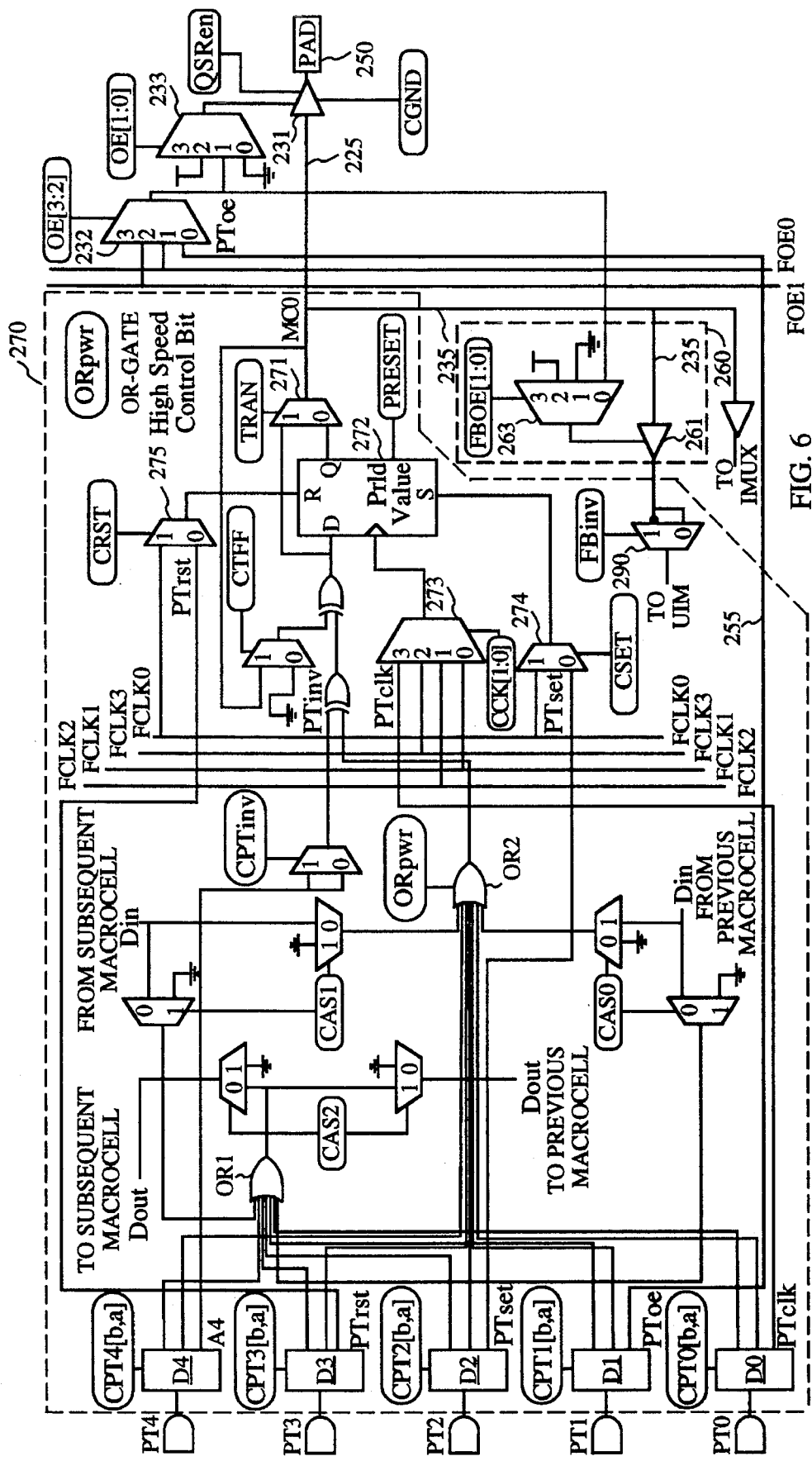
FIG. 6 is a schematic diagram showing a feedback switching circuit according to the first aspect of the present invention.

FIG. 6 is a schematic diagram showing one macrocell 270 of function block 210, along with a portion of I/O block 230. As mentioned above, each function block 210 associated with Xilinx XC7000 series EPLDs typically includes an AND array (not shown) and nine macrocells, each of the nine macrocells being substantially identical to macrocell 270.

Referring to FIG. 6, macrocell 270 receives five product terms (Pterms) PT0 through PT4 from the function block AND array (not shown). These five Pterms are selectively transmitted to various elements within macrocell 270 via circuits D0 through D4 which operate basically as 1:3 multiplexers. All of the Pterms PT0 through PT4 are respectively connectable via circuits D0 through D4 either to export OR gate OR1, or to macrocell OR gate OR2. The output of macrocell OR gate OR2 is connected to the D input of flip flop 272, whereas the output of export OR gate OR1 is applied to export line Dout.

In addition to the connection to export OR gate OR1 or to macrocell OR gate OR2, product term PT0 is also connectable to clock input of macrocell flip flop 272 through 4-to-1 multiplexer 273. Multiplexer 273 is programmable to connect any one of PT0 or global clock lines FCLK0, FCLK1 and FCLK2 to the clock input of flip flop 272. Stated briefly, global clock lines FCLK0, FCLK1 and FCLK2 are used to control switching of several commonly-controlled macrocells using a global signal. When a global clock signal is used in macrocell 270, PT0 is available for use as an input to OR1 or OR2. However, if macrocell 270 requires a special clock signal (i.e., one which is not available on a global clock line), then PT0 must be used to provide the special clock signal to flip flop 272.

Likewise, product term PT1 is also connectable to multiplexer 232 via circuit D1 and line 255. Multiplexer 232 is programmable to connect any one of PT1 or global output enable (OE) lines FOE0 and FOE1 to an output enable switch 231 through multiplexer 232. Similar to the global clock lines, global OE lines FOE0 and FOE1 are used to control the outputs of several commonly-controlled macrocells using a global signal, thereby allowing PT1 (to which line 255 is connected) to be used for other purposes.

Product term PT2 is also connectable through 2-to-1 multiplexer 274 to the SET terminal of flip flop 272 via circuit D2. Multiplexer 274 is programmable to connect PT2 or global set/reset line FRS0 to the SET terminal of flip flop 272. Global set/reset line FRS0 functions in a manner similar to the above-mentioned global clock lines and global OE lines.

Product term PT3 is also connectable through 2-to-1multiplexer 275 to the RESET terminal of flip flop 272 via circuit D3. Multiplexer 275 is programmable to connect PT3 or global set/reset line FRS0 to the SET terminal of flip flop 272.

Finally, product term PT4 is also connectable to the D input of flip flop 272 via circuit D, allowing a user to bypass the macrocell OR gate OR2.

Macrocell 270 can implement sequential logic functions by registering an output signal in flip flop 272, or combinatorial logic by bypassing flip flop 272 using multiplexer 271. Multiplexer 271 is controlled by memory cell TRAN, and its output forms macrocell output line 225. Macrocell output signals are passed on macrocell output line 225 to switch 231 of I/O block 230, which in turn is programmable to transmit the macrocell output signal to I/O pin 250. Control of switch 231 is provided by memory cells CSRen, CGND, and by multiplexers 232 and 233, which are respectively controlled by memory elements OE[3:2] and OE[1:0]. As mentioned above, multiplexer 232 selectively applies a signal from one of OE line 255 and global OE lines FOE0 and FOE1 to an input of multiplexer 233. Multiplexer 233 selectively applies one of a low signal, a high signal, and a selected output enable (from multiplexer 232) to OE switch 231.

Feedback line 235 is connected to macrocell output line 225 and transmits the macrocell output signal to switch 261. The control terminal of switch 261 is connected to the output of a multiplexer 263, which is selectively programmable via memory element FBOE[1:0] to apply low or high (ON or OFF) signals to switch 261, or to selectively control the switched state of switch 261 using the global OE signals FOE0 and FOE1 or an output enable signal provided on Pterm line PT1, as transmitted from multiplexer 232.

Finally, an inverting multiplexer 290 is connected between the switch 261 and interconnect matrix 220, and is controlled by memory cell FBinv. Inverting multiplexer 290 allows the feedback signal on feedback line 235 to be transmitted to interconnect matrix 220 in a true or complemented form.

Figure 7:
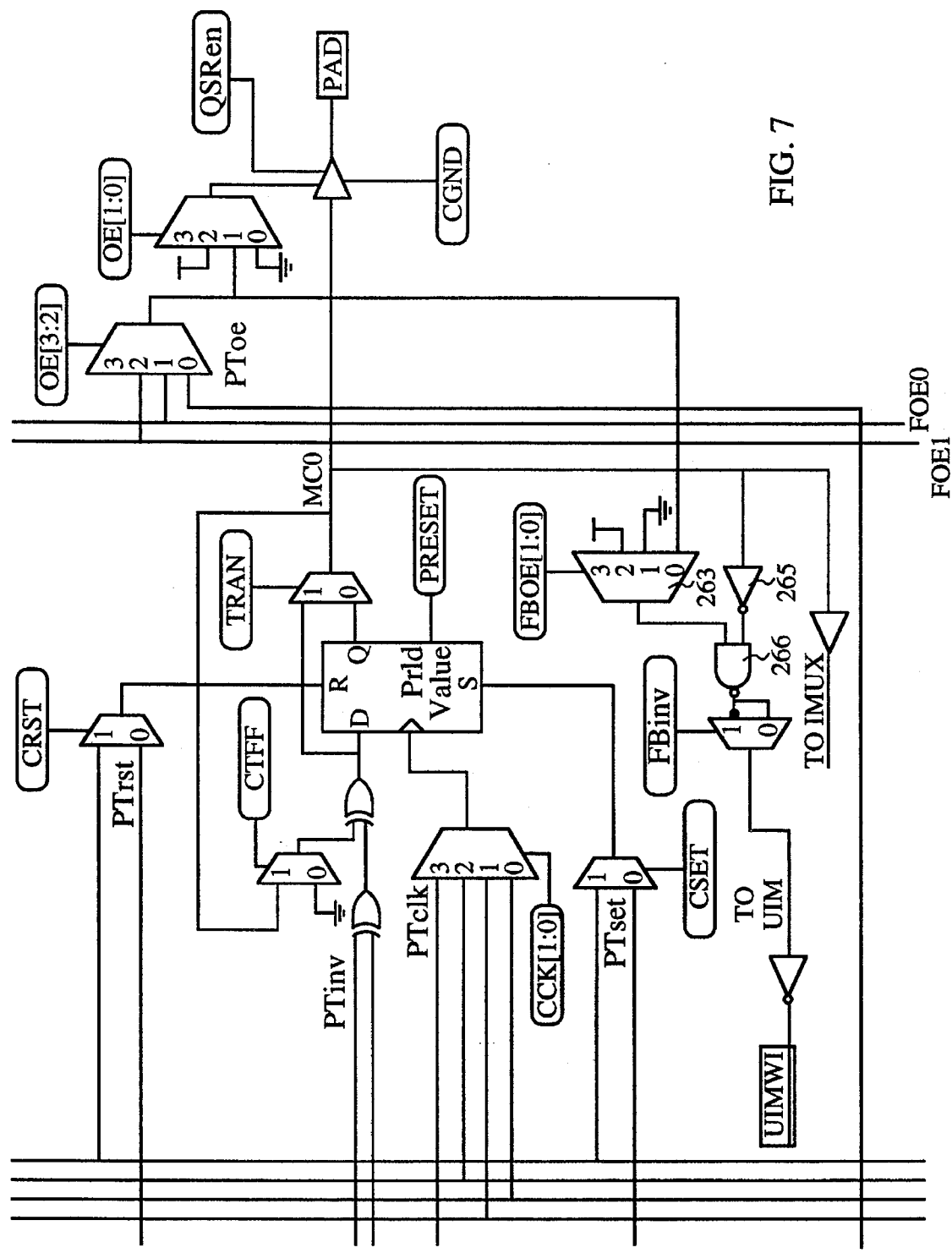
FIG. 7 is a schematic diagram showing a second embodiment of the feedback switching circuit.

FIG. 7 is a schematic diagram showing a second embodiment of the feedback switching circuit 260, in which switch 261 of FIG. 6 is implemented using an inverter 265 and a NAND gate 266. Those of ordinary skill in the art will recognize that the switch 261 can be implemented using similar types of logic circuits, and the above-mentioned first aspect is not limited to any particular switching circuitry.

Figure 8:
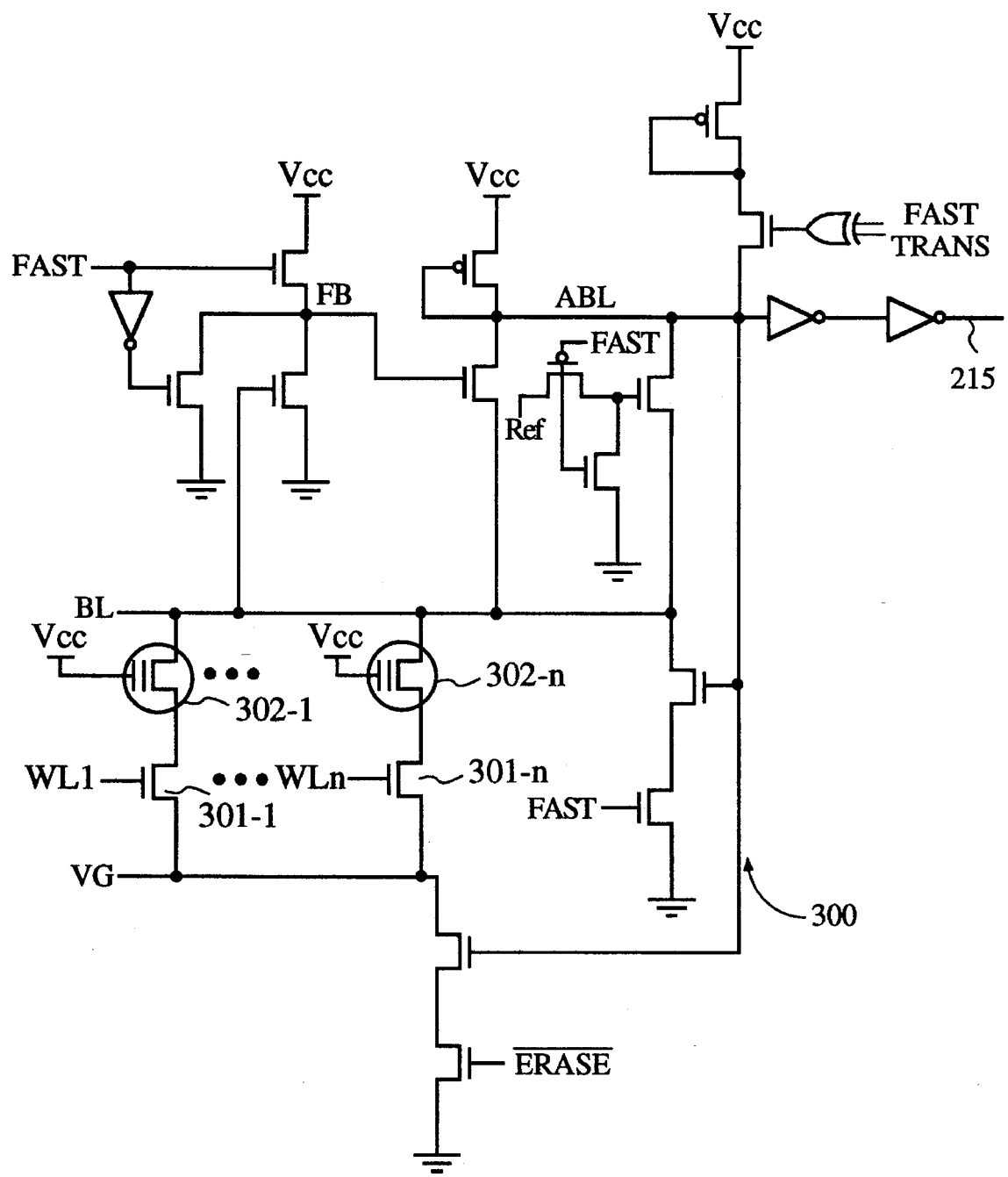
FIG. 8 is a schematic diagram showing a sense amplifier according to a second aspect of the present invention.

FIG. 8 shows a sense amplifier 300 in accordance with a second aspect of the present invention. Sense amplifier 300 is fully described in co-owned U.S. application Ser. No. 08/459,066, filed Jun. 2, 1995, entitled "SENSE AMPLIFIER FOR PROGRAMMABLE LOGIC DEVICE HAVING SELECTABLE POWER MODES" [attorney docket X-152-1/M-3372], which is incorporated herein in its entirety, and is referred to below as the "SENSE AMPLIFIER" application.

As with the prior art interconnect matrix 120 (discussed above), interconnect matrix 220 includes a plurality of intersecting wordlines and bitlines. The wordlines and bitlines are programmably associated by EPROM cells and access transistors, as described below. By erasing a selected EPROM cell, a signal on a selected wordline can cause an associated bitline to enter a logic 1 or 0 state. The logic state on the bitline is then passed as an input signal to function block 210 (FIG. 5) on one of the 21 FB input lines 215 via sense amplifier 300.

Referring to FIG. 8, each wordline WL1 through WLn of sense amplifier 300 is coupled to the gate of one access transistor 301-1 through 301-n. As discussed above, wordlines WL1 through WLn are connected to at least some of the feedback lines 235 and/or device input lines 245 of EPLD 200. The source of each access transistor is connected to virtual ground line VG. EPROM cells 302-1 through 302-n are respectively connected between access transistors 301-1 through 301-n and bitline BL, and include control gates connected to Vcc. To "connect" a selected wordline to bitline BL, an associated EPROM cell 302 is erased (conductive) using methods known in the art. For example, to connect wordline WL1 to bitline BL, EPROM 302-1 is erased. Thereafter, a high signal on wordline WL1 turns on access transistor 301-1, thereby connecting bitline BL to ground through EPROM 301-1 and access transistor 301-1.

Figure 1:
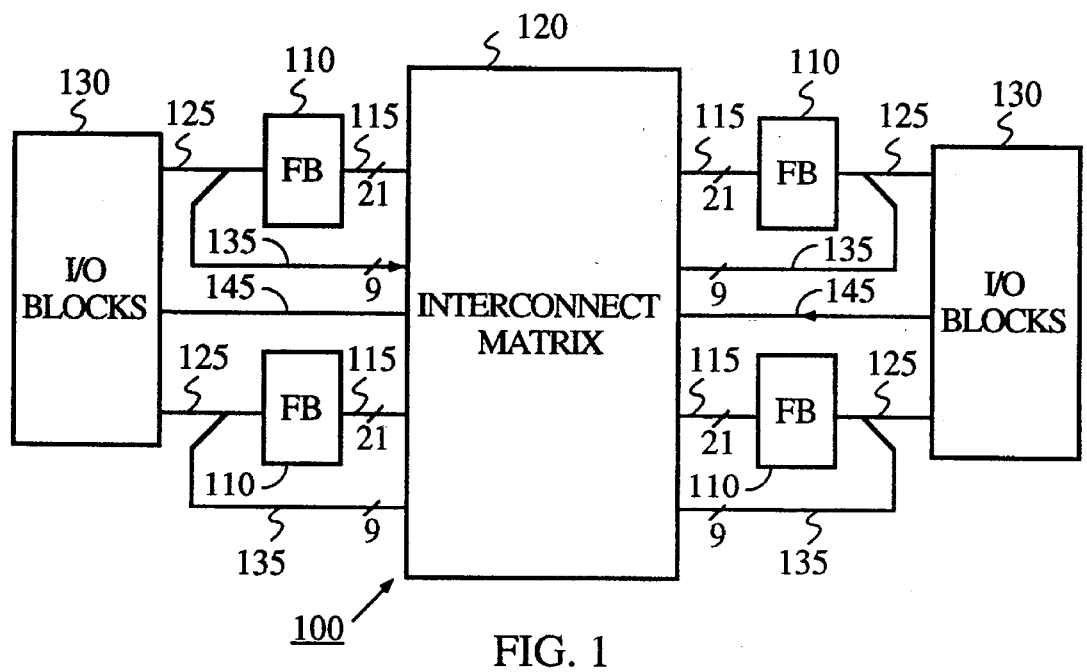
FIG. 1 is a block diagram showing the main portions of a known EPLD.
Figure 2:
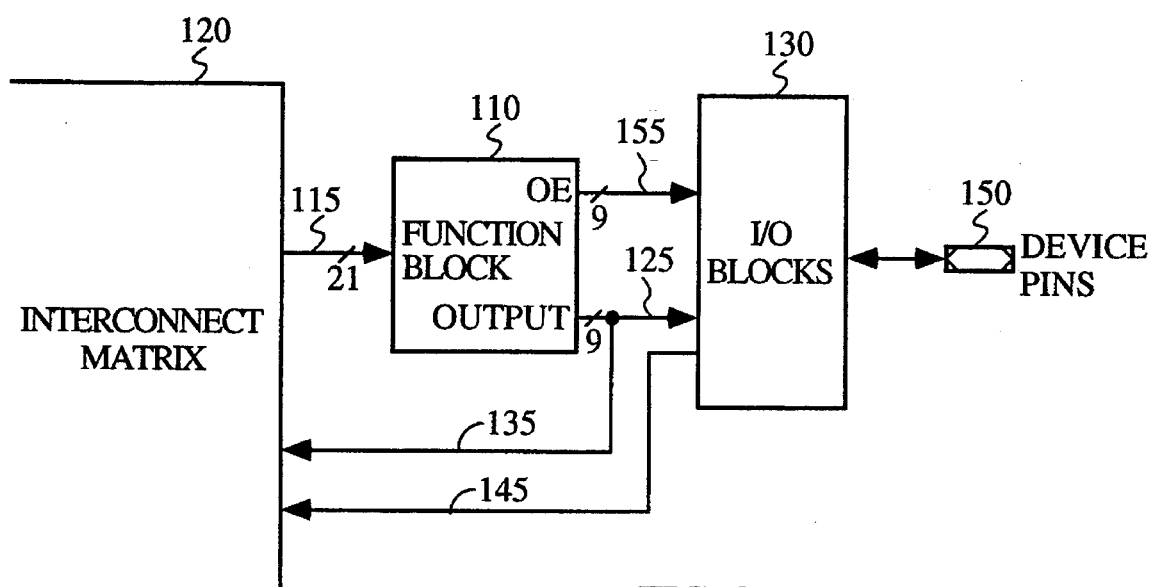
FIG. 2 is a block diagram showing connections between a function block and an I/O block of the known EPLD.
Figure 3:
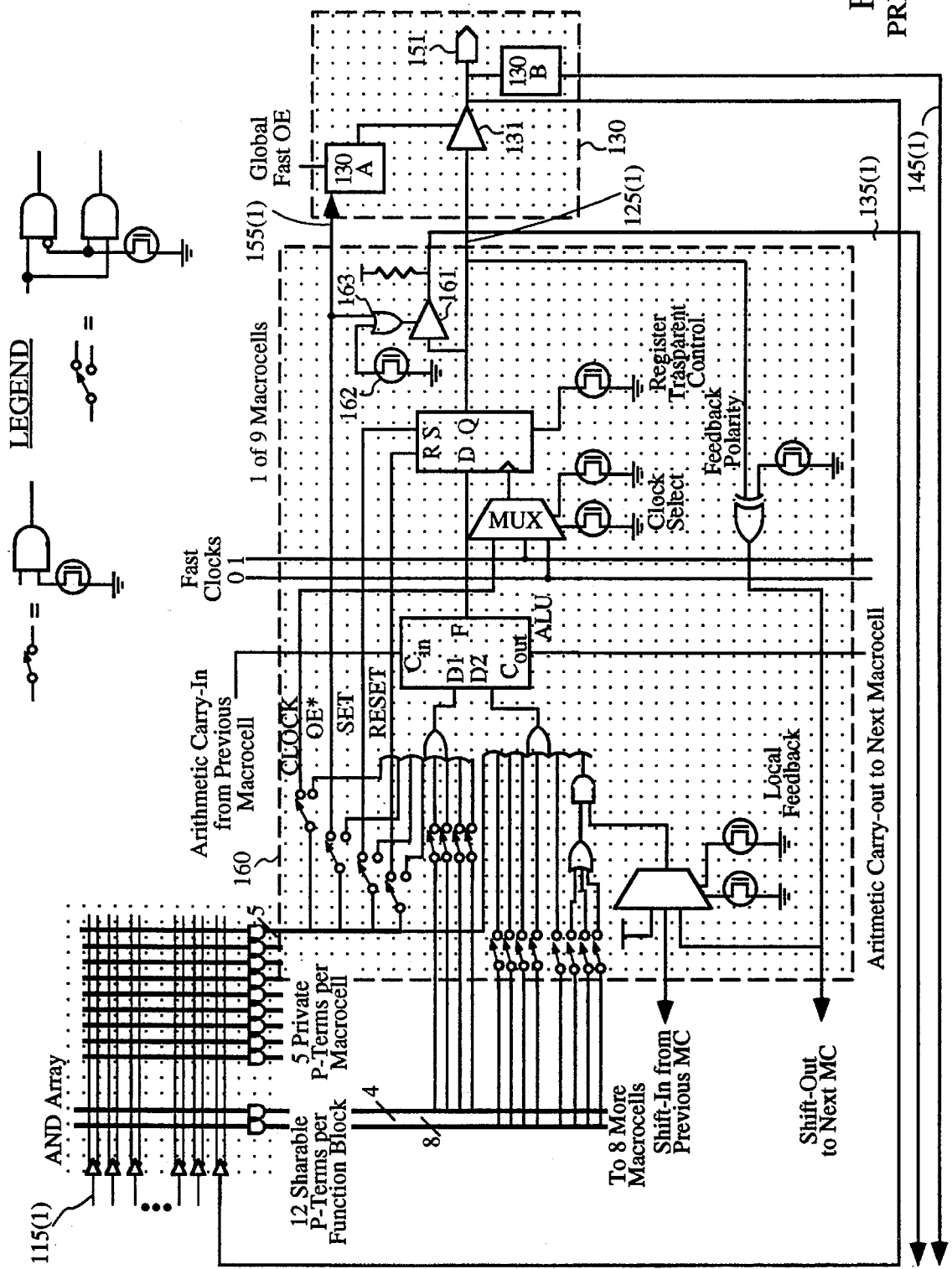
FIG. 3 is a simplified circuit diagram showing a macrocell and an I/O block of the known EPLD.
Figure 4:
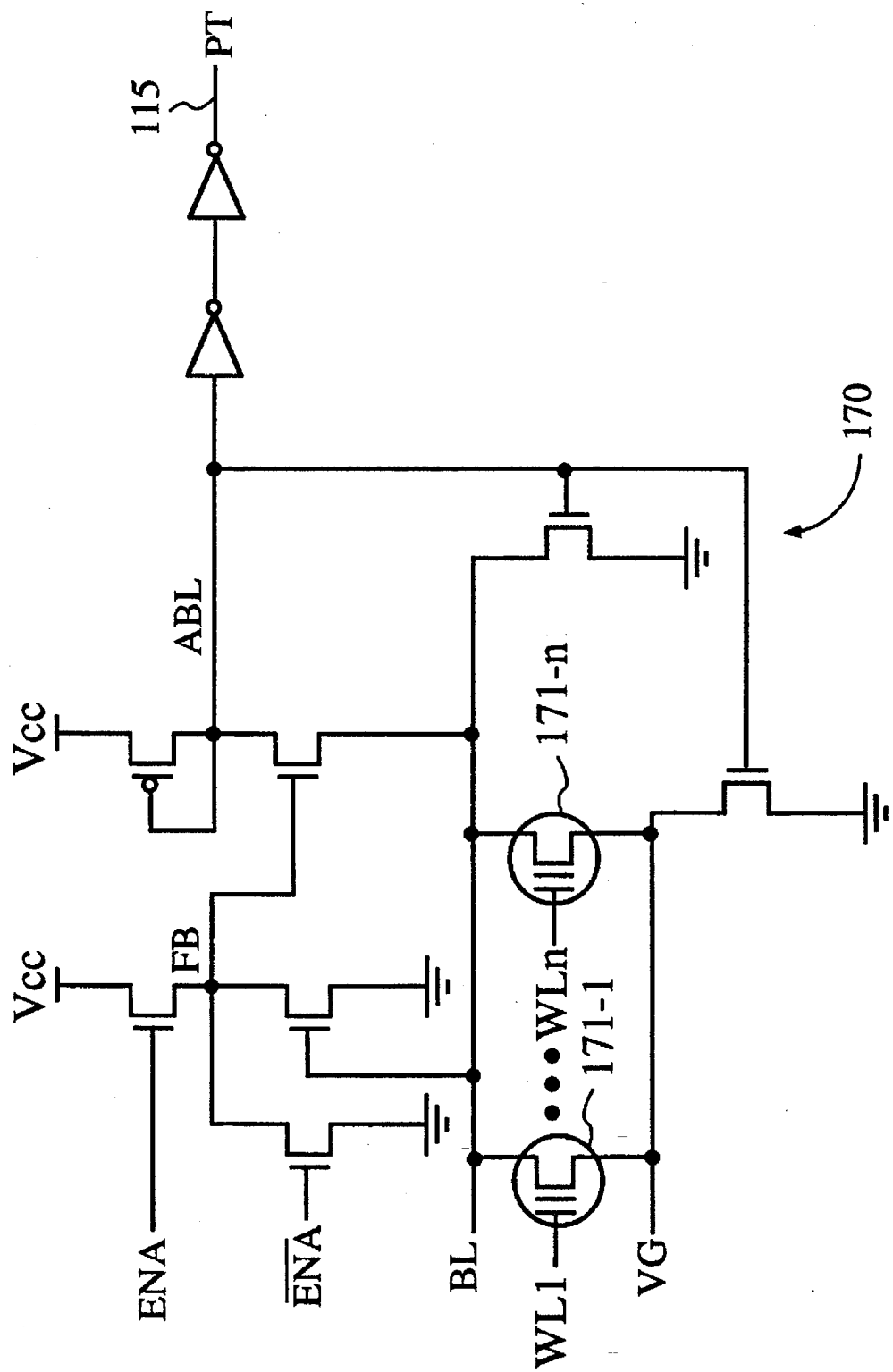
FIG. 4 is a simplified circuit diagram showing a known sense amplifier.

In operation, feedback signals or device input signals are transmitted via wordlines WL1 through WLn to access transistors 301-1 through 301-n. Sense amplifier 300 reduces the coupling effect caused by multiple wordline switching in a cross-point interconnect matrix because flash EPROM cells 302 are connected between access transistors 301 and bitline BL, thereby isolating bitline BL from wordlines WL1 through WLn. Referring briefly to FIG. 4, coupling noise was a particular problem in the prior art sense amplifier 170 because the most dominant coupling between wordlines WL1 through WLn and bitline BL in sense amplifier 170 is from the gate to the drain, the drain being connected directly to bitline BL. However, sense amplifier 300 eliminates this coupling component by isolating bitline BL from the drain of access transistors 301 using EPROM cells 302. That is, EPROM cells 302 act as effective shields which prevent signals on wordlines WL1 through WLn from creating noise on bitline BL.

Further discussion regarding the operation and benefits of sense amplifier 300 are provided in the above-mentioned co-owned "SENSE AMPLIFIER" application. One additional feature of sense amplifier 300, which is described in the "SENSE AMPLIFIER" application, is that sense amplifier 300 is selectively programmable to operate in a high power mode, in which sense amplifier 300 operates at high switching speeds, or in a lower power mode. During operation in the high power mode, the operating voltage bit line swing is extremely small, and hence is more sensitive to coupling noise. The various aspects of the present invention described herein combine to reduce the coupling noise in general. However, it is understood that the various aspects described herein sometimes do not reduce coupling noise to an acceptable level. In these instances, sense amplifier 300 can be switched to the low power mode in the manner described in the "SENSE AMPLIFIER" application, whereby, in the low power mode, the operating voltage bit line swing is larger, hence providing much better immunity to coupling noise when compared to the high power mode.

In accordance with a third aspect of the present invention, unused macrocells are employed to produce counteractive wordline switching signals, thereby reducing coupling noise in a cross-point interconnect matrix. Those of ordinary skill in the art recognize that when an EPLD is used to implement a logic function, several of the EPLDs macrocells are typically unused. In accordance with the third aspect, these unused macrocells are utilized to produce feedback signals which are opposite in sense with commonly clocked wordline switching signals.

As an example of the third embodiment, when an EPLD is implemented to produce a 15-bit counter, two function blocks (each containing nine macrocells) are typically employed, thereby leaving at least three unused macrocells on the EPLD. Typically, the fifteen macrocells are clocked by a common signal and produce a concurrent switching event when some or all of the macrocells switch from logic 1 to logic 0. In accordance with the third embodiment, the unused macrocells are programmed to switch in an opposite sense from the three least-significant bits of the counter, thereby counteracting the coupling effect caused when these three macrocells switch concurrently. This counteractive effect also significantly reduces the coupling effect produced when additional macrocells associated with the counter are concurrently switched, such as when the counter "turns over", i.e., changes from all logic highs (1s) to lows (0s). Of course, if additional unused macrocells are available on the EPLD, these unused macrocells can also be employed to counteract noise caused by the concurrent switching event.

In the above example, a multiple concurrent switching event can be predicted whenever the counter "turns over". However, in many applications, it is difficult to predict whether several commonly-clocked signals will produce a multiple concurrent switching event. In addition, it is noted that device input signals (i.e., signals entering the interconnect matrix from device input lines 245 of FIG. 5) may also contribute to a multiple concurrent switching event. Finally, unclocked (combinatorial) feedback signals or device input signals may also coincidentally combine to produce multiple concurrent switching events. Therefore, in accordance with one aspect of the third embodiment of the present invention, every signal entering the interconnect matrix associated with a logic function is counteracted by the feedback signal generated by an unused macrocell (i.e., a macrocell which is not used to implement the logic function). Of course, in practice, the number of unused macrocells is typically less than the number of signals entering the interconnect matrix, so it becomes necessary to identify the most likely sources of multiple concurrent switching event, and to program the available unused macrocells to minimize the coupling noise caused by these signals.

Figure 9:
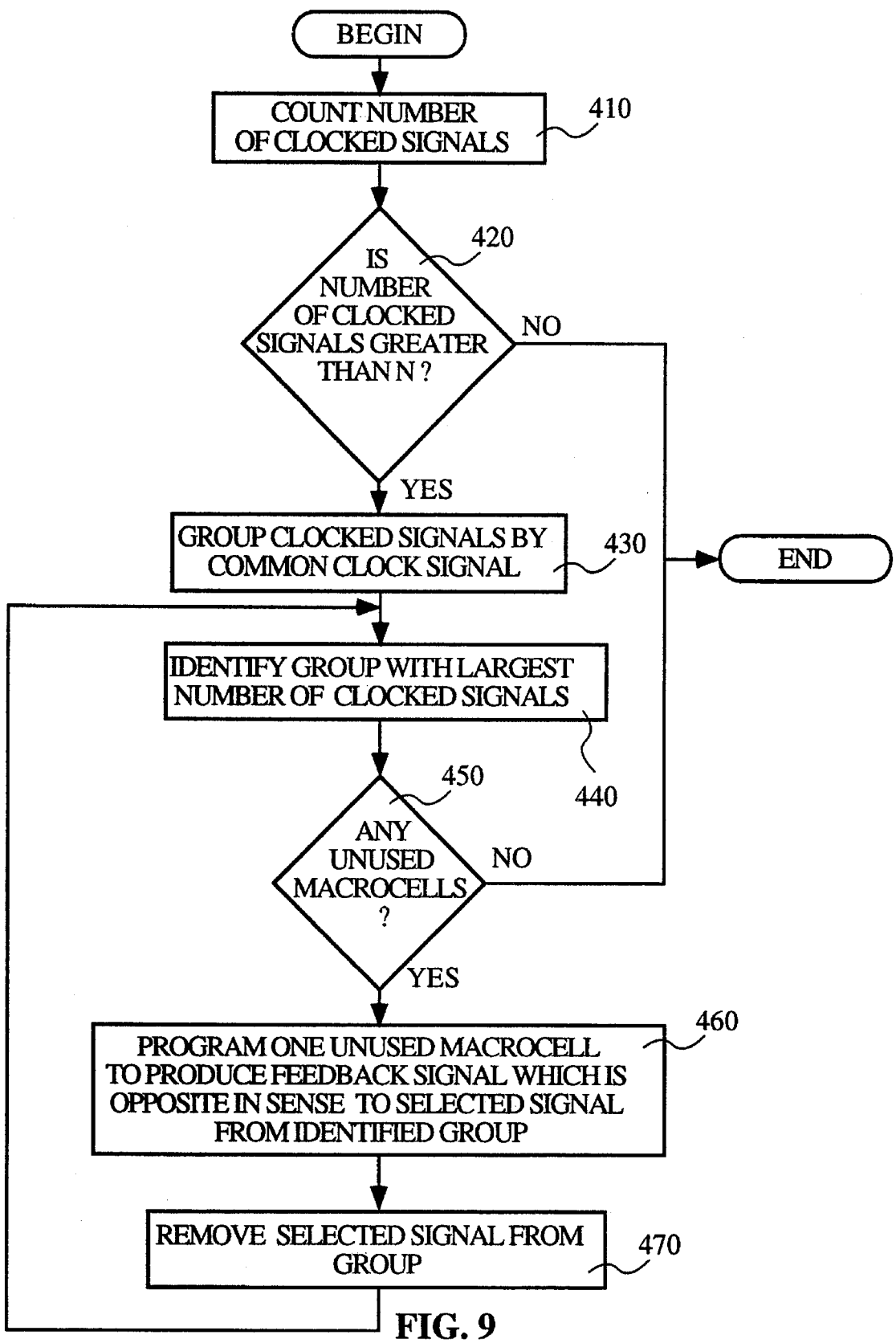
FIG. 9 is a flow diagram showing a process for employing unused macrocells to reduce coupling noise in accordance with a third aspect of the present invention.

FIG. 9 is a flowchart illustrating one embodiment of the method according to the third embodiment. This method is employed while connections within an EPLD are being determined (i.e., a mapping step), and is implemented in conjunction with mapping software.

Referring to FIG. 9, in step 410, the logic function implemented by the EPLD is analyzed to identify and count commonly clocked signals associated with the logic function. Commonly clocked signals are identified by the clock associated with each logic signal.

In step 420, the number of clocked signals is compared with a predetermined number. If the number of clocked signals is less than the predetermined number (which is determined by the size of the EPLD), then the program ends. If the number of clocked signals is greater than the predetermined number, then the process proceeds to step 430.

In step 430, the clocked signals are grouped according to their common clock signal. For example, if the all of the clocked signals are associated with one of the clock signals transmitted on global clock lines FCLK0, FCLK1 and FCLK2 (see FIG. 6), then the signals are grouped into three groups.

In step 440, the group having the largest number of signals is identified. For example, if a first group associated with global clock line FCLK0 contains 25 signals, a second group associated with global clock line FCLK1 contains 20 signals, and a third group associated with global clock line FCLK2 contains 15 signals, then the first group is selected. The largest group is selected because it has the potential of creating the most significant coupling noise if all 25 signals produce a multiple concurrent switching event. If two or more groups have the same number of signals, and this number is the largest number, then one of the groups is selected arbitrarily.

In step 450, it is determined whether there are any unused macrocells associated with the EPLD. If so, then the process proceeds to step 460. If not, the process ends.

In step 460, an unused macrocell is selected from the unused macrocells along with one of the signals from the largest group (i.e., from the group identified in step 440). The selected unused macrocell is then programmed to produce a feedback signal which is opposite in sense with the selected signal.

Finally, in step 470, the selected signal from the largest group is removed from consideration (i.e., the largest group now contains one less signal). The program then loops up to step 440 and the groups of commonly clocked signals are re-analyzed and a largest group is selected. When an unused macrocell has been assigned to every signal of all of the groups, or when all unused macrocells have been assigned, the process ends.

The process shown in FIG. 9 is merely illustrative, and it is recognized that several variations are possible. For example, the process may omit the identification of clocked signals altogether and randomly match unused macrocells with logic function signals. In addition, the process shown in FIG. 9 assumes that the number of unused macrocells is less than the number of clocked signals. In another variation, after all of the clocked signals have been matched to an unused macrocell, if any unused macrocells remain, the process may counteract unclocked signals until all unused macrocells have been programmed.

Noise in an EPLD also occurs when a multiple concurrent switching event creates a crowbar effect on the power busses, such as Vcc and Vss. For example, referring to the sense amplifier 300 shown in FIG. 8, when several wordlines WL1 through WLn are concurrently switched on such that bitline BL is pulled low, the high current through these wordlines can strain Vcc, thereby creating noise which affects the operation of the EPLD.

Noise due to the crowbar effect can overwhelm all other attempts to reduce noise on an EPLD. Therefore, the transistors linking Vcc and Vss to the bitlines and wordlines of the interconnect matrix must be carefully designed to minimize crowbar noise. That is, these transistors must be produced such that they provide sufficient resistance to a concurrent switching event. In the alternative, resistors may be utilized between these transistors and Vcc/Vss. Of course, it is recognized that selection of a suitable resistance must take into account the speed of the device.

Although the invention is described herein with reference to the embodiments shown in FIGS. 5–9, one skilled in the art will readily appreciate that other devices/circuits and methods may be substituted for those set forth herein without departing from the spirit and scope of the present invention. In alternate embodiments of the invention, the logic may be inverted or mixed to allow the use of devices which respond to differing logic levels. For example, sense amplifier 300 can be adapted to operate with either or both of NMOS and PMOS devices. Accordingly, the invention should only be limited by the claims included below.

We claim:

1. A method for reducing coupling noise in an interconnect matrix of an erasable programmable logic device (EPLD), the interconnect matrix including a plurality of intersecting wordlines and bitlines, the EPLD also including a function block having inputs connected to the bitlines of the interconnect matrix, the function block including an AND array and a plurality of macrocells, the wordlines of the interconnect matrix receiving feedback signals from the macrocells and device input signals from input/output pins of the EPLD, the feedback signals and device input signals being associated with a logic function implemented by the EPLD, the method comprising the steps of:

selecting a signal from the feedback signals and the device input signals associated with the logic function;

identifying an unused macrocell of the EPLD which is not used to implement the logic function;

programming the identified unused macrocell to produce a feedback signal which is opposite in sense to the selected signal.

2. The method of claim 1, wherein the step of selecting a signal from the feedback signals and the device input signals comprises:

forming groups of said feedback signals and said device signals which are associated with common clock lines;

identifying one of the formed groups containing a largest number of feedback signals and device input signals; and selecting one of the feedback signals and the device input signals in the identified group.

* * * * *